United States Patent
Goida et al.

(10) Patent No.: US 9,533,878 B2
(45) Date of Patent: Jan. 3, 2017

(54) LOW STRESS COMPACT DEVICE PACKAGES

(71) Applicant: ANALOG DEVICES, INC., Norwood, MA (US)

(72) Inventors: Thomas M. Goida, Windham, NH (US); Kathleen O'Donnell, Arlington, MA (US); Michael Delaus, Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/567,801

(22) Filed: Dec. 11, 2014

(65) Prior Publication Data

US 2016/0167951 A1 Jun. 16, 2016

(51) Int. Cl.
*H01L 23/495* (2006.01)
*B81B 7/00* (2006.01)
(Continued)

(52) U.S. Cl.
CPC ......... *B81B 7/0074* (2013.01); *B81C 1/00301* (2013.01); *H01L 23/13* (2013.01);
(Continued)

(58) Field of Classification Search
CPC .......... H01L 23/12; H01L 23/13; H01L 23/48; H01L 23/50; H01L 24/01; H01L 24/02; H01L 24/10; H01L 24/18; H01L 24/26; H01L 24/17; H01L 24/33; H01L 24/80; H01L 24/81; H01L 24/83; H01L 24/89; B81B 7/0009; B81B 7/0032; B81B 7/0074; B81C 1/00261; B81C 1/00325; B81C 1/00333
See application file for complete search history.

(56) References Cited

U.S. PATENT DOCUMENTS 4,303,934 A   12/1981   Stitt
5,247,597 A    9/1993   Blacha et al.
(Continued)

OTHER PUBLICATIONS

Kim et al., "Multi-flip chip on lead frame overmolded IC package: A novel packaging design to achieve high performance and cost effective module package," Electronic Components and Technology Conference, 2005, pp. 1819-1821.
(Continued)

*Primary Examiner* — Selim Ahmed
*Assistant Examiner* — Evan Clinton
(74) *Attorney, Agent, or Firm* — Knobbe, Martens, Olson & Bear LLP (57) ABSTRACT

Various low stress compact device packages are disclosed herein. An integrated device package can include a first integrated device die and a second integrated device die. An interposer can be disposed between the first integrated device die and the second integrated device die such that the first integrated device die is mounted to and electrically coupled to a first side of the interposer and the second integrated device die is mounted to and electrically coupled to a second side of the interposer. The first side can be opposite the second side. The interposer can comprise a hole through at least the second side of the interposer. A portion of the second integrated device die can extend into the hole.

20 Claims, 8 Drawing Sheets

(51) Int. Cl.
   *B81C 1/00*    (2006.01)
   *H01L 25/18*   (2006.01)
   *H01L 23/498*  (2006.01)
   *H01L 23/13*   (2006.01)
   *H01L 23/34*   (2006.01)
   *H01L 23/00*   (2006.01)

(52) U.S. Cl.
   CPC ........ *H01L 23/34* (2013.01); *H01L 23/49816* (2013.01); *H01L 23/49827* (2013.01); *H01L 24/14* (2013.01); *H01L 25/18* (2013.01); H01L 24/13 (2013.01); H01L 24/16 (2013.01); H01L 24/32 (2013.01); H01L 24/73 (2013.01); H01L 24/83 (2013.01); H01L 2224/131 (2013.01); H01L 2224/13144 (2013.01); H01L 2224/1403 (2013.01); H01L 2224/14051 (2013.01); H01L 2224/16145 (2013.01); H01L 2224/16227 (2013.01); H01L 2224/32145 (2013.01); H01L 2224/32225 (2013.01); H01L 2224/48227 (2013.01); H01L 2224/73203 (2013.01); H01L 2224/83851 (2013.01); H01L 2225/06513 (2013.01); H01L 2225/06537 (2013.01); H01L 2225/06572 (2013.01); H01L 2924/1433 (2013.01); H01L 2924/1461 (2013.01); H01L 2924/157 (2013.01); H01L 2924/15151 (2013.01); H01L 2924/15153 (2013.01); H01L 2924/15311 (2013.01); H01L 2924/3025 (2013.01)

(56) References Cited

U.S. PATENT DOCUMENTS

| | | | |
|---|---|---|---|
| 5,293,069 A | 3/1994 | Kato et al. | |
| 5,689,091 A | 11/1997 | Hamzehdoost et al. | |
| 6,326,611 B1 | 12/2001 | Kennedy et al. | |
| 6,388,336 B1 | 5/2002 | Venkateshwaran et al. | |
| 6,489,686 B2 | 12/2002 | Farooq et al. | |
| 6,490,161 B1* | 12/2002 | Johnson | H01L 23/4006 165/185 |
| 6,777,789 B1 | 8/2004 | Glenn et al. | |
| 6,787,916 B2 | 9/2004 | Halahan | |
| 6,821,817 B1 | 11/2004 | Thamby et al. | |
| 7,209,362 B2 | 4/2007 | Bando | |
| 7,217,994 B2* | 5/2007 | Zhu | H01L 23/5385 257/686 |
| 7,224,058 B2 | 5/2007 | Fernandez | |
| 7,408,244 B2 | 8/2008 | Lee et al. | |
| 7,411,281 B2 | 8/2008 | Zhang | |
| 7,489,025 B2 | 2/2009 | Chen et al. | |
| 7,619,303 B2 | 11/2009 | Bayan | |
| 7,858,437 B2 | 12/2010 | Jung et al. | |
| 8,080,925 B2 | 12/2011 | Berger et al. | |
| 8,115,307 B2 | 2/2012 | Toyama et al. | |
| 8,399,994 B2 | 3/2013 | Roh et al. | |
| 8,653,635 B2 | 2/2014 | Gowda et al. | |
| 8,842,951 B2 | 9/2014 | Doscher et al. | |
| 9,156,673 B2 | 10/2015 | Bryzek et al. | |
| 9,195,055 B2 | 11/2015 | Oberst et al. | |
| 2002/0090749 A1 | 7/2002 | Simmons et al. | |
| 2003/0104651 A1 | 6/2003 | Kim et al. | |
| 2004/0007750 A1* | 1/2004 | Anderson | B81B 7/007 257/414 |
| 2005/0046003 A1 | 3/2005 | Tsai | |
| 2005/0101161 A1 | 5/2005 | Weiblen et al. | |
| 2005/0104196 A1* | 5/2005 | Kashiwazaki | H01L 23/13 257/706 |
| 2005/0285239 A1 | 12/2005 | Tsai et al. | |
| 2006/0261453 A1 | 11/2006 | Lee et al. | |
| 2009/0032926 A1 | 2/2009 | Sharifi | |
| 2009/0070727 A1 | 3/2009 | Solomon | |
| 2009/0282917 A1 | 11/2009 | Acar | |
| 2010/0019393 A1 | 1/2010 | Hsieh et al. | |
| 2010/0133629 A1 | 6/2010 | Zhang et al. | |
| 2010/0187557 A1 | 7/2010 | Samoilov et al. | |
| 2010/0200998 A1 | 8/2010 | Furuta et al. | |
| 2010/0244217 A1 | 9/2010 | Ha et al. | |
| 2011/0024899 A1 | 2/2011 | Masumoto et al. | |
| 2011/0062572 A1 | 3/2011 | Steijer et al. | |
| 2011/0133847 A1 | 6/2011 | Ogura et al. | |
| 2012/0027234 A1 | 2/2012 | Goida | |
| 2012/0241925 A1* | 9/2012 | Yoon | H01L 21/563 257/666 |
| 2013/0032388 A1 | 2/2013 | Lin et al. | |
| 2013/0069218 A1 | 3/2013 | Seah | |
| 2014/0027867 A1 | 1/2014 | Goida | |
| 2014/0191419 A1* | 7/2014 | Mallik | H01L 25/0652 257/777 |
| 2014/0217566 A1 | 8/2014 | Goida et al. | |
| 2014/0252569 A1 | 9/2014 | Ikuma et al. | |
| 2015/0210538 A1 | 7/2015 | Su et al. | |
| 2016/0046483 A1 | 2/2016 | Cheng et al. | |
| 2016/0090298 A1 | 3/2016 | Sengupta et al. | |

OTHER PUBLICATIONS

European Search Report dated Oct. 16, 2015 issued in EP Application No. 14152487.6 in 6 pages.
European Search Report issued Sep. 29, 2015 in European Patent Application No. 14152487.6 filed Jan. 24, 2014, in 5 pages.

* cited by examiner

LOW STRESS COMPACT DEVICE PACKAGES

BACKGROUND

Field of the Invention

The field relates to integrated devices and methods for packaging the same. More particularly, the field relates to devices and methods for improving three-dimensional (3D) packaging and integration and reducing stresses in packages.

Description of the Related Art

Efforts are continually being made to reduce or minimize the size of integrated device packages. For example, it can be important to reduce or minimize both the height of an integrated device package (also referred to as "the package") and the footprint of the package on an external device substrate, such as a printed circuit board (PCB). The size of the package can be based at least in part on the type of device to be packaged. For example, some integrated device packages can include more than one integrated device die. In some implementations with multiple device dies, the dies can simply be placed side by side on a package substrate, such as a leadframe or a PCB material. Placing the device dies adjacent one another on the package substrate can occupy valuable package real estate and can disadvantageously enlarge the footprint of the package on the external device (e.g., a motherboard).

One way to reduce the package footprint on the external device is to stack multiple integrated device dies on top of one another, instead of placing them adjacent one another. While stacking can reduce the area of the package substrate (and thereby reduce the footprint on the external device substrate), stacking can also increase the height of the package. Accordingly, low profile and low footprint integrated device packaging can be beneficial in a variety of devices and arrangements.

Moreover, in various types of devices, stresses can be induced on the integrated device package. For example, in molded packages that are encapsulated with a molding material, the molding material may protect the dies from environmental contamination or impact. However, overmolding can also cause undesirable stresses and strains that can damage the integrated device dies under various conditions. In some arrangements, changes in temperature and/or moisture level in the molding material can cause the molding material to expand and/or contract differentially in different regions, which can also cause undesirable stresses in the device die(s). Accordingly, there is a continuing need to reduce stresses in integrated device packages.

Thus, it can be advantageous to reduce stresses in integrated device packages, without increasing the height of the packages and maintaining a reduced package footprint.

SUMMARY

In one embodiment, an integrated device package is disclosed. The integrated device package can include a first integrated device die and a second integrated device die. An interposer can be disposed between the first integrated device die and the second integrated device die such that the first integrated device die is mounted to and electrically coupled to a first side of the interposer and the second integrated device die is mounted to and electrically coupled to a second side of the interposer. The first side can be opposite the second side. The interposer can comprise a hole through at least the second side of the interposer, a portion of the second integrated device die extending into the hole.

In another embodiment, an integrated device package is disclosed. The integrated device package can include a first integrated device die having a first side, a second side opposite the first side, and a hole through at least the first side. The package can include a second integrated device die mounted to and electrically coupled with the first side of the first integrated device die. A portion of the second integrated device die can extend into the hole. The package can include an electrical contact disposed on the first side of the first integrated device die. The electrical contact can be configured to electrically connect to an external substrate with the first side of the first integrated device die facing the external substrate.

In yet another embodiment, a method of manufacturing an integrated device package is disclosed. The method can include mounting a first integrated device die to a first side of an interposer. The method can include inserting a portion of a second integrated device die into a hole of the interposer. The method can include mounting the second integrated device die to a second side of the interposer that is opposite the first side.

In yet another embodiment, a method of manufacturing an integrated device package is disclosed. The method can include providing a first integrated device die having an electrical contact on a first side of the first integrated device die. The electrical contact can be configured to electrically connect to an external system board with the first side of the first integrated device die facing the external substrate. The method can include inserting a portion of a second integrated device die into a hole defined through the first side of the first integrated device die. The method can include mounting the second integrated device die to the first side of the first integrated device die. In some embodiments, the hole can comprise a through hole. In some embodiments, the first integrated device die comprises a processor die, and the second integrated device die comprises a microelectromechanical systems (MEMS) die. In some embodiments, the electrical contact comprises a plurality of electrical contacts disposed on the first side of the first integrated device die, wherein a height of the electrical contacts is greater than a thickness of the portion of the second integrated device die that is disposed outside the hole.

For purposes of summarizing the embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the embodiments may be implemented or carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION

For integrated device packages (also referred to as "packages" herein) having multiple integrated device dies (also referred to as "device dies" or "dies" herein), it can be advantageous to reduce both the package footprint and the package height. One way to reduce the package footprint on an external device (e.g., on an external device motherboard or system board) is to stack multiple integrated device dies instead of placing them adjacent one another on a package substrate. Such vertical stacking of chips is sometimes referred to in the art as three-dimensional (3D) packaging. Yet, in some embodiments, as described above, it can be desirable to balance the resulting increase in package height caused by stacking with the reduction in package footprint. Accordingly, it can be advantageous to design low profile packages (e.g., packages having a short height), while also maintaining a small package footprint on the external device substrate (such as a PCB).

Moreover, stresses induced on the device dies can damage active components of the dies, which can reduce or impair device performance. For example, movements or shocks to the device can damage components of the device dies. Moreover, packages that utilize a molding material or encapsulant may be subject to stresses caused by the molding material or encapsulant. It should be appreciated that the moisture content and/or temperature of the molding material can change throughout the lifetime of the system, including during manufacturing, testing, shipment, and/or use. Changes in moisture content and/or temperature can cause the molding material to expand and/or contract, which can induce stresses on active components of device dies and can damage or impair the performance of the dies. Accordingly, it can be advantageous to shield integrated device dies with sensitive components from external stresses or forces.

Various embodiments disclosed herein can advantageously reduce or maintain the overall height of the package while reducing or eliminating stresses on the die caused by external events or components, or components of the package. For example, in some embodiments, the package can include a first integrated device die, a second integrated device die, and an interposer disposed between the first integrated device die and the second integrated device die. Disposing the portion of the second die in the hole can advantageously protect the portion from external stresses or forces, at the same time as reducing the overall height of the package. For example, the portion of the second die can be freely disposed in the hole such that the portion is isolated from other components of the package.

In other embodiments, the package can include a first device die and a second device die. A portion of the second die can be disposed in a hole of the first die. Disposing the portion of the second die in the hole of the first die can advantageously reduce the height of the package while shielding the portion of the second die from external stresses. One or more electrical contacts of the first die can be disposed about the portion of the second die that is outside the hole. The electrical contacts can have a height greater than a thickness of the portion of the second die that is outside the hole. The electrical contacts can be disposed on a first side of the first device die, and the second die can be mounted to the first side of the first die. The first side of the first die can face the larger external device substrate (e.g., a motherboard) when the electrical contacts electrically connect to the external device substrate. In some embodiments, the package may not be encapsulated by a molding material. Further, the portion of the second die that is within the hole can face inwardly and can be free of contact with other components (e.g., adhesives, substrates, other device dies, etc.).

The embodiments illustrated herein can comprise integrated device packages in which the first die comprises a processor die and the second die comprises a microelectromechanical systems (MEMS) die. For example, the processor die can comprise any suitable type of processor, such as an Application Specific Integrated Circuit (ASIC). The MEMS die can comprise any suitable type of MEMS die, such as an inertial motion sensor die (e.g., a gyroscope, accelerometer, etc.), a switching die, or any other suitable type of die. The processor die and MEMS die can electrically communicate with one another such that the processor die can receive and process electrical signals from the MEMS die for pre-processing and/or analysis. The MEMS die can comprise a cap that covers or otherwise protects the underlying MEMS device. The cap of the MEMS die can be disposed in the hole of the interposer or a hole of the processor die in order to protect the cap (and the underlying device) and to reduce the height of the package. Although the illustrated embodiments are directed to processor and MEMS dies, it should be appreciated that any other type of integrated device die can be used in combination with each of the embodiments disclosed herein.

Figure 1A:
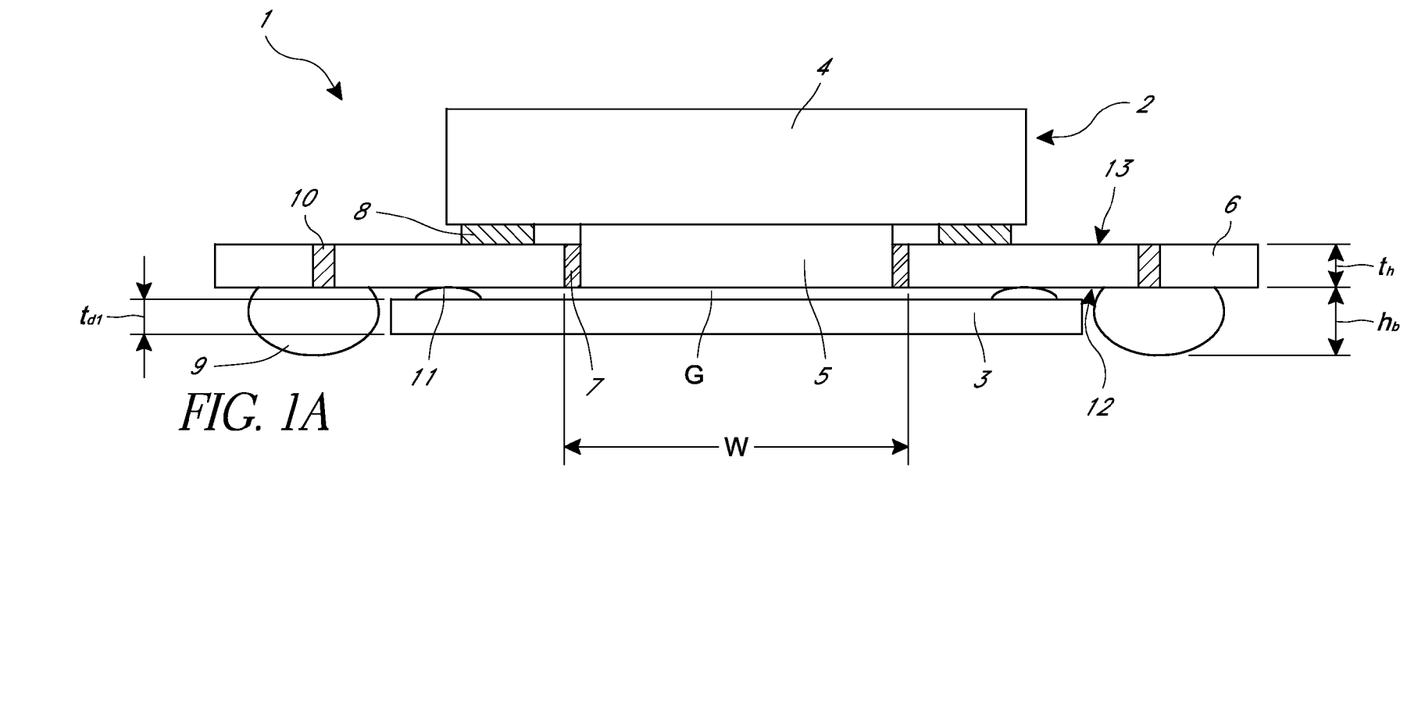
FIG. 1A is a schematic side cross-sectional view of an integrated device package in which an interposer with a through hole is disposed between a first integrated device die and a second integrated device die, according to one embodiment.
Figure 1B:
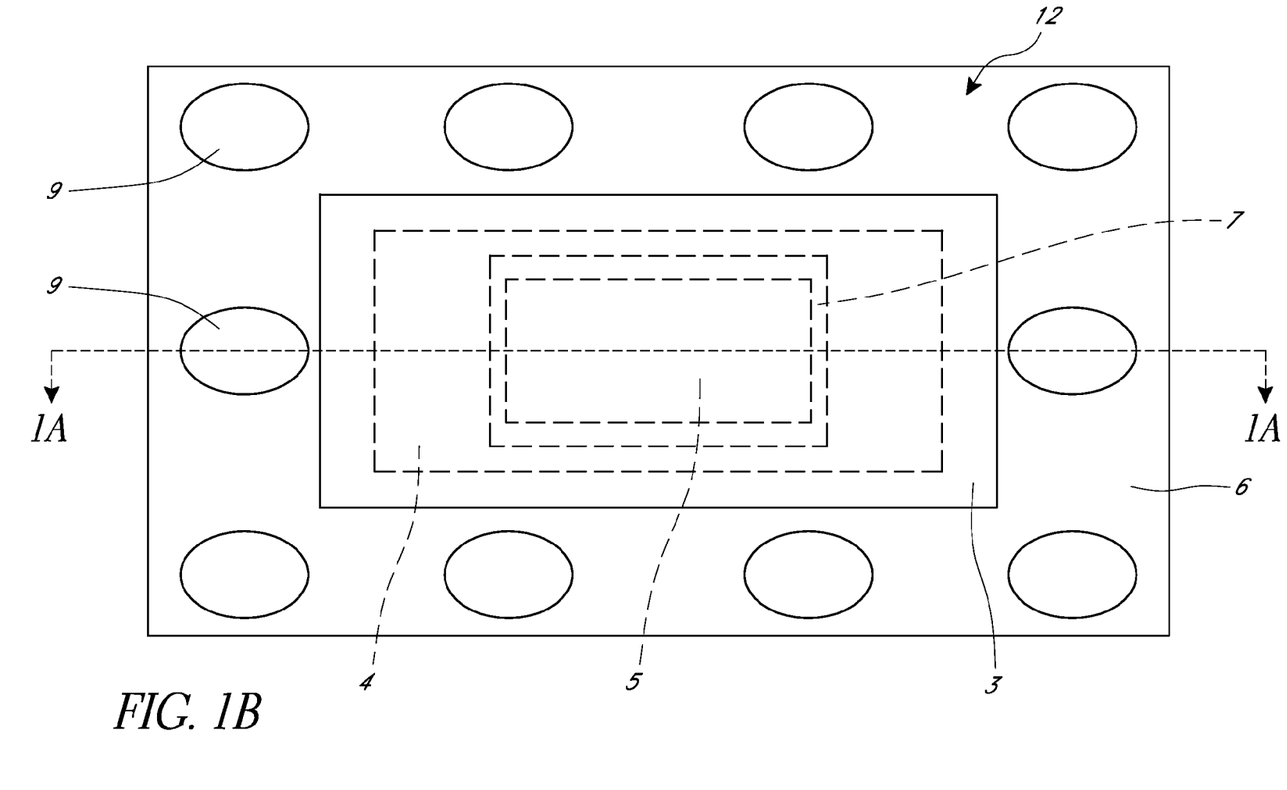
FIG. 1B is a bottom plan view of the integrated device package of FIG. 1A.

FIG. 1A is a schematic side cross-sectional view of an integrated device package 1 comprising a first integrated device die 3, a second integrated device die 2, and an interposer 6 disposed between the first device die 3 and the second device die 2. As shown in FIG. 1A, the interposer can have a hole 7 that is formed through the entire thickness of the interposer 6, e.g., a through hole. FIG. 1B is a bottom plan view of the integrated device package of FIG. 1A. The first die 3 can comprise a processor die in some embodiments, such as an ASIC die. As shown in FIG. 1A, the first die 3 can be mounted to and electrically coupled with a first side 12 of the interposer 6. Bond pads of the first die 3 can electrically communicate with the interposer 6 by way of one or more first contact(s) 11. The first contacts 11 can comprise any suitable type of electrical interconnect, such as a solder ball, a metallic (e.g., gold) stud or interconnect, anisotropic conductive film (ACF), conductive paste, or any other type of connector. As shown in FIG. 1A, the first die 3 can be flip-chip mounted to the first side 12 of the interposer 6. In other embodiments, however, the first die 3 may be wire bonded or otherwise electrically coupled with the interposer 6.

Further, the second die 2 can be mounted to and electrically coupled with a second side 13 of the interposer 6 that is opposite the first side 12. The second die 2 can comprise a MEMS device die in some arrangements. For example, the second die 2 can comprise a MEMS motion sensor die (e.g., a gyroscope, an accelerometer, etc.), a switching die, or any other type of MEMS die. The second die 2 can include a base portion 4 and an attachment 5 extending from or coupled with the base portion 4. The MEMS device and other active components of the die 2 may be formed or defined in the base portion 4. The attachment 5 can comprise a cap that covers or protects the MEMS device or other active components of the base portion 4, allowing a movable member of the MEMS to freely move within a protected cavity covered by the attachment 5. As shown in FIG. 1A, the attachment 5 can be disposed in the hole 7 of the interposer 6.

Bond pads of the second die 2 (e.g., the base portion 4) can electrically communicate with the second side 13 of the interposer 6 by way of one or more second contact(s) 8, which can also physically connect the second die 2 to the interposer 6. The second contacts 8 can comprise any suitable type of electrical interconnect, such as a solder ball, a metallic (e.g., gold) stud, pillar or interconnect, anisotropic conductive film (ACF), conductive paste, or any other type of connector. The second die 2 can be flip-chip mounted to the second side 13 of the interposer 6. FIG. 1A illustrates the first die 3 disposed on the first side 12 of the interposer 6 and the second die 2 (e.g., the base portion 4 of the die 2) disposed on the second side 13 of the interposer 6. In other embodiments, the first die 3 can be disposed on the second side 13 and the second die 2 can be disposed on the first side 12.

The interposer 6 can comprise any suitable type of platform that supports and provides electrical communication between the first and second dies 3, 2. For example, the interposer 6 can comprise a laminate or printed circuit board (PCB) substrate, a ceramic substrate, a metallized polymer substrate, a metallized glass substrate, a molded leadframe, a silicon interposer, or any other suitable type of platform. In some embodiments, it can be desirable to provide an interposer 6 having a material with a coefficient of thermal expansion (CTE) that closely matches the CTE of the device dies 3, 2. For example, for silicon device dies 3, 2, it can be desirable to use a silicon interposer 6 in some arrangements. One or more interconnects 10 can provide electrical communication between the first and second sides 12, 13 of the interposer 6 to electrically couple the first die 3 and the second die 2. For example, the first die 3 can process electrical signals received from the second die 2 for pre-processing and/or analyzing the signals. The interconnects 10 can comprise any suitable type of interconnect, such as an internal trace, wires, metallic studs, through silicon vias (TSVs), or any other suitable interconnect.

As shown in FIG. 1A, disposing the attachment 5 in the hole 7 of the interposer 6 can reduce the overall height of the package by a thickness of the hole $t_h$, which in the case of a through hole is the same as the thickness of the interposer 6. Disposing the attachment 5 in the hole 7 can reduce the height compared to packages in which the attachment 5 is disposed outside the hole 7. The hole 7 may be dimensioned to receive the width and height of the attachment 5. For example, the hole 7 can have a major dimension W (e.g., a length or diameter) in the lateral direction that is in a range of about 1 mm to about 5 mm. Moreover, although the hole 7 shown in FIG. 1B is rectangular in profile, the hole 7 can have any suitable shape, such as circular, square, pentagonal, triangular, hexagonal, etc. In addition, it should be appreciated that disposing the attachment 5 in the hole 7 can enable the use of a thicker base portion 4 while maintaining or reducing the overall height of the package 1. For example, in some embodiments, the thickness or height of the base portion 4 can be made thicker to increase the stability of the second die 2 and reduce external stresses on the die 2. The increased thickness of the base portion 4 may be accommodated by disposing the attachment 5 (or a portion thereof) into the hole 7.

Furthermore, as shown in FIG. 1A, the attachment 5 can freely float inside the hole 7 with a gap G between the bottom of the attachment 5 and the top of the first die 3, such that the attachment 5 does not contact any adhesive, encapsulant, heat slug, device die, substrate, or other components of the package 1 (such as the interposer 6 or the first die 3), or components external to the package 1. Also, the package 1 shown in FIG. 1A does not include a molding material or encapsulant, and can be employed on an external device as shown, without encapsulant. Isolating the attachment 5 from other system components (and/or not including a molding material) can advantageously reduce or eliminate stresses imposed on sensitive areas on or underlying the attachment 5 or the active surface of the base portion 4. Further, the first device die 3 disposed over the hole 7 can assist in protecting the attachment 5 from external stresses without contacting the attachment 5.

With reference to FIGS. 1A and 1B, one or more third electrical contacts 9 can be disposed on the first side 12 of the interposer. The third electrical contacts 9 can serve as package leads configured to electrically and physically connect to an external substrate or motherboard that is part of the larger electronic system. The third electrical contacts 9 can be any suitable type of electrical contact, such as solder balls, metallic studs or interconnects, anisotropic conductive film, conductive paste, or any other suitable connector. In the embodiment of FIGS. 1A-1B, for example, the third electrical contacts 9 comprise a plurality of solder balls.

The third electrical contacts 9 can be disposed around an outer perimeter of the first integrated device die 3. The third contacts 9 can have a height $h_b$ that is greater than a thickness $t_{d1}$ of the first device die 3, such that a lowermost extent of the contacts 9 is positioned below a lowermost extent of the first device die 3. As shown in FIG. 1A, the first integrated device die 3 can therefore be disposed in a space defined by the external substrate or board (not shown), the third electrical contacts 9, and the interposer 6. Disposing the first die 3 in such a space may also protect sensitive components of the first die 3. Furthermore, by using the interposer 6 to provide electrical communication between the dies 3, 2 and the external board, the embodiment of FIGS. 1A-1B can advantageously be implemented without using through-silicon vias (TSVs) in the dies 3, 2 for providing electrical communication. Rather, electrical connections between the respective dies 3, 2 and the interposer 6 can provide electrical communication to the external board.

Figure 1C:
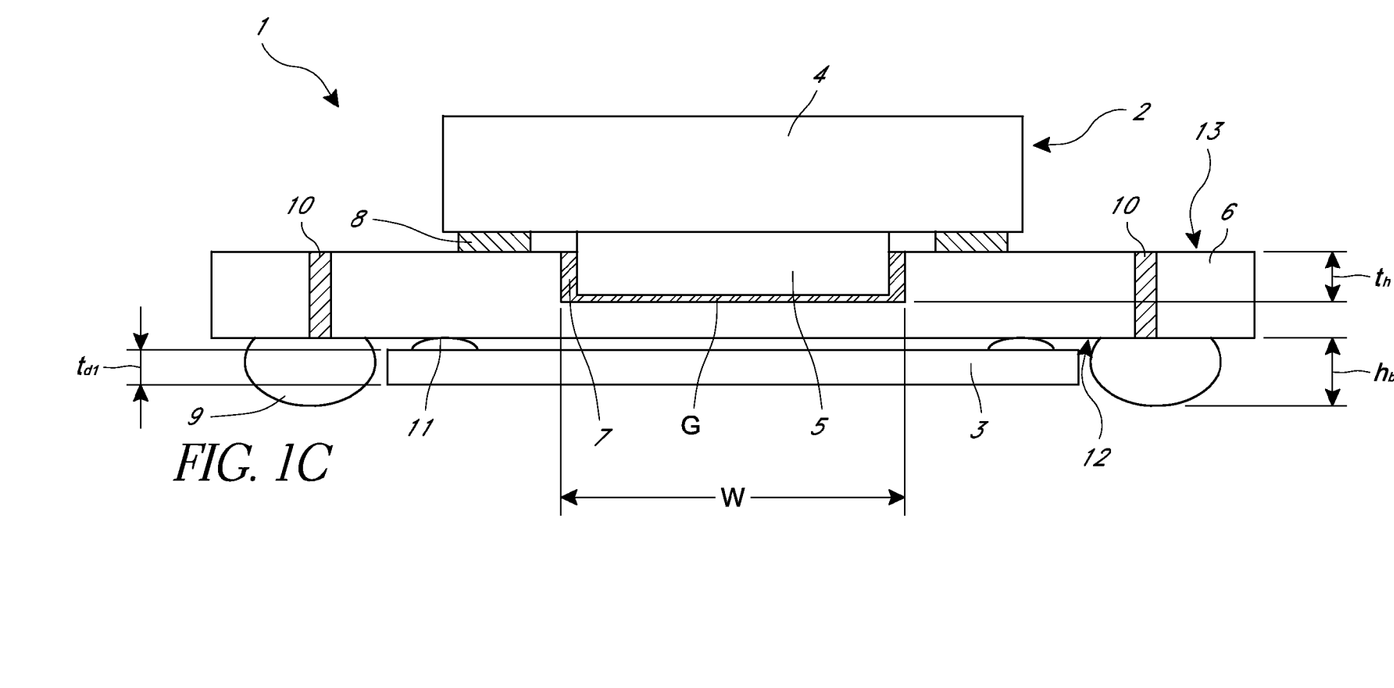
FIG. 1C is a schematic side cross-sectional view of an integrated device package in which an interposer with a recess is disposed between a first integrated device die and a second integrated device die, according to another embodiment.

FIG. 1C is a schematic side cross-sectional view of an integrated device package 1 comprising a first integrated device die 3, a second integrated device die 2, and an interposer 6 disposed between the first device die 3 and the second device die 2, according to another embodiment. Unless otherwise noted, components that are the same as or similar to components of FIGS. 1A-1B are denoted by the same reference numerals. For example, as with FIGS. 1A-1B, the first die 3 can comprise a processor die, and the second die 2 can comprise a MEMS die. The first die 3 can be mounted to the first side 12 of the interposer 6, and the second die 2 (e.g., the base portion 4) can be mounted to the second side 13 of the interposer 6. One or more first contacts 11 can electrically and physically couple the first die 3 with the interposer 6, and one or more second contacts 8 can electrically and physically couple the base portion 4 of the second die 2 with the interposer 6. Third contacts 9 can be disposed on the first side 12 of the interposer 6 and can serve as package leads configured to electrically and physically connect to an external system board (not shown). A height of the third contacts 9 can be greater than a thickness of the first die 3 such that a lowermost extent of the third contacts 9 is below a lowermost extent of the first die 3.

However, unlike the embodiment of FIGS. 1A-1B, the interposer 6 comprises a hole 7 in the form of a recess that is formed or defined only partially through a thickness of the interposer 6. The attachment 5 of the second die 2 (which can comprise a protective cap over a MEMS device) can be disposed in the hole 7. As with the embodiment of FIGS. 1A-1B, positioning the attachment 5 in the hole 7 can reduce the overall height of the package 1 by a thickness $t_h$ of the hole 7, less the thickness of any gap G between the downward-facing surface of the attachment 5 and the floor of the hole 7. Furthermore, the attachment 5 can be freely disposed in the hole 7 with the illustrated gap G to isolate or shield the attachment 5 and other sensitive components from external stresses and forces. In addition, the floor of the recessed hole 7 (e.g., the portion of the interposer 6 at the bottom of the hole 7) can assist in protecting the attachment 5.

Figure 2A:
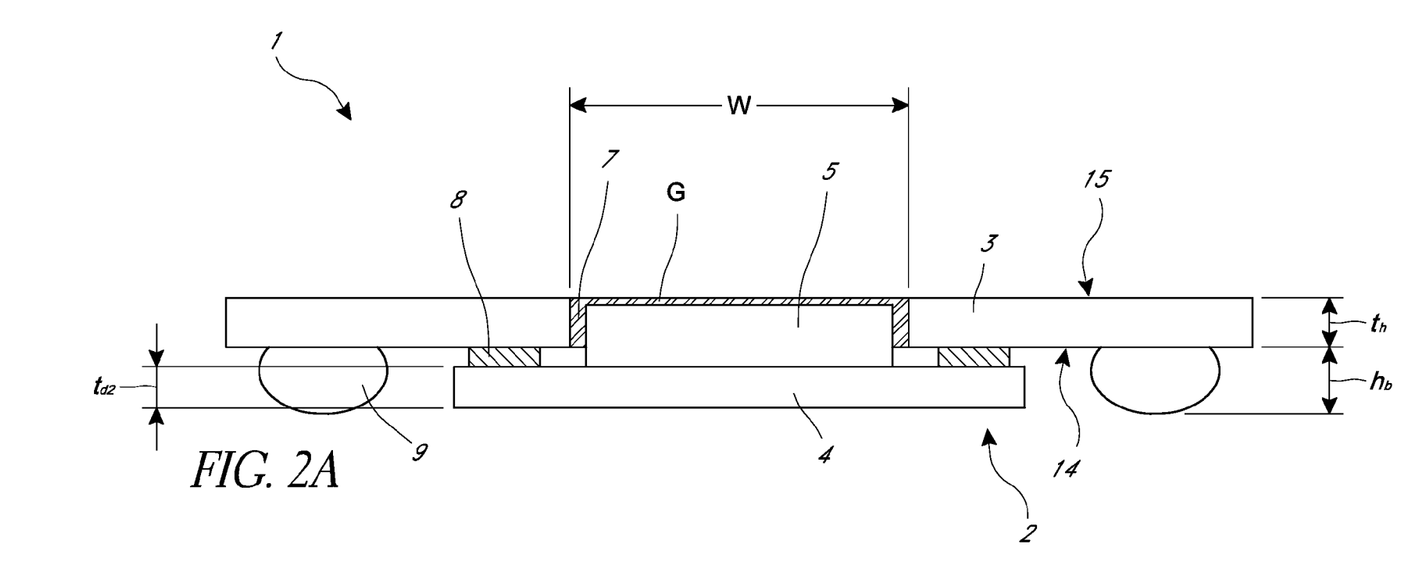
FIG. 2A is a schematic side cross-sectional view of an integrated device package in which a first integrated device die with a through hole is coupled with a second integrated device die on the underside of the first integrated device die, according to one embodiment.
Figure 2B:
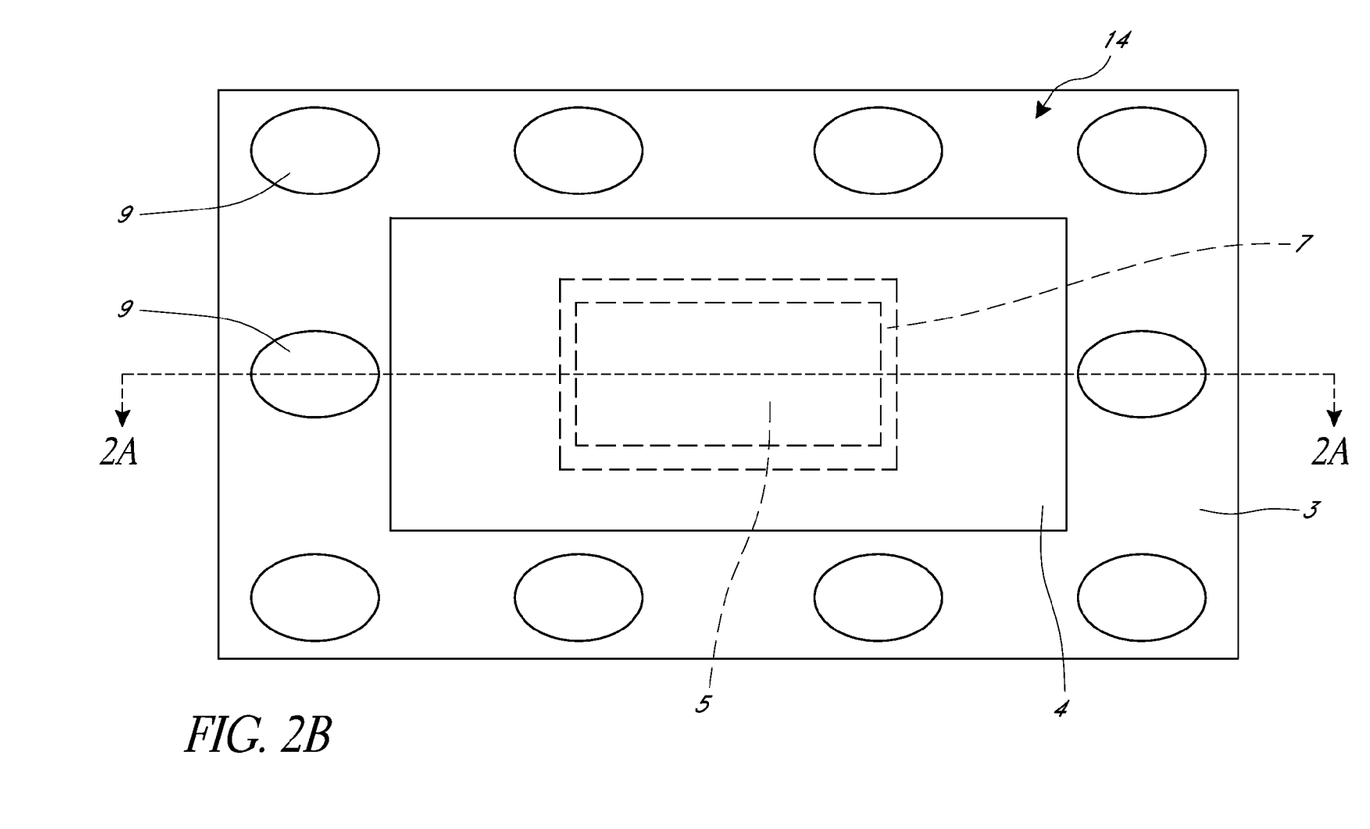
FIG. 2B is a bottom plan view of the integrated device package of FIG. 2A.

FIG. 2A is a schematic side cross-sectional view of an integrated device package 1 in which a first integrated device die 3 with a hole 7 is coupled with a second integrated device die 2 on the underside of the first integrated device die 1, according to one embodiment. FIG. 2B is a bottom plan view of the integrated device package 1 of FIG. 2A. As with the embodiments of FIGS. 1A-1C, the first die 3 can comprise a processor die, such as an ASIC die. The first device die 3 can comprise a first side 14 and a second side 15 opposite the first side 14. The second die 2 can be mounted to and electrically coupled with the first side of the first die 3. As shown in FIG. 2A, the first and second dies 3, 2 can be flip-chip mounted directly to one another, without an interposer.

The second die 2 can comprise a MEMS device die in some arrangements. For example, the second die 2 can comprise a MEMS motion sensor die (e.g., a gyroscope, an accelerometer, etc.), a switching die, or any other type of MEMS die. The second die 2 can include a base portion 4 and an attachment 5 extending from or coupled with the base portion 4. The MEMS device and other active components of the die 2 may be formed or defined in the base portion 4. The attachment 5 can comprise a cap that covers or protects the MEMS device or other active components of the base portion 4. As shown in FIG. 2A, the attachment 5 can be disposed in the hole 7 of the first integrated device die 3.

The second die 2 (e.g., the base portion 4) can electrically communicate with the first side 14 of the first die 3 by way of one or more first contact(s) 8. The first contacts 8 can comprise any suitable type of electrical interconnect, such as a solder ball, a metallic (e.g., gold) stud or interconnect, anisotropic conductive film (ACF), conductive paste, or any other type of connector. The first die 3 can thereby receive electrical signals from the second die 2 for pre-processing and/or analyzing the signals.

The hole 7 in the first die 3 shown in FIG. 2A comprises a through hole. As with the embodiment of FIGS. 1A-1C, disposing the attachment 5 of the second die in the hole 7 of the first die 3 can advantageously reduce the overall height of the package by a thickness $t_h$ of the hole 7, which in the case of a through hole 7 is the thickness of the first die 3. In the embodiment of FIGS. 2A-2B, however, the lateral footprint of the package may be increased because the first die 3 is widened to accommodate the width of the attachment 5. Furthermore, as with the above embodiments, disposing the attachment 5 in the hole 7 can advantageously shield the attachment 5 and underlying sensitive portions of the second die 2 from stresses caused by external factors, such as other components within the package (e.g., the first die 3), a molding material, and/or external forces from the outside environs. As illustrated, the upper surface of the attachment 5 may be recessed within the hole 7, leaving a vertical gap G between the top of the attachment 5 and the top or second side 15 of the first die 3. In some embodiments, the package 1 does not include a molding material or encapsulant.

With reference to FIGS. 2A-2B, one or more second contact(s) 9 can be disposed on the first side 14 of the first integrated device die 3. The second contacts 9 can serve as package leads configured to electrically connect with an external system board. When the first die 3 and the external system board are mounted to one another (e.g., by way of a flip-chip connection), the first side 14 of the first die 3 can face the external board. As shown in FIG. 2B, the second contacts 9 comprise a plurality of solder balls that are disposed around a perimeter of the second die 2, e.g., around an outer perimeter of the base portion 4. The second contacts 9 can have a height $h_b$ that is greater than a thickness $t_{d2}$ of the second device die 2 (or, more particularly, the base portion 4 of the die 2 that is outside the hole 7). Thus, the second contacts 9 can have a lowermost extent that is positioned below a lowermost extent of the second device die 2. When the first die 3 is mounted to the external board, the base portion 4 can be disposed within a space defined by the external board, the second contacts 9, and the first die 3.

Although the second die 2 is illustrated as being mounted to the first side 14 of the first die 3, in other arrangements, the second die 2 can be disposed on the second side 15 of the first die 3 such that the first die 3 is disposed underneath the second die 2. In such an arrangement, the base portion 4 of the second die 2 can be wider than the first die 3 and electrical contacts 9 can connect the base portion 4 to the external board. However, in such an arrangement, through-silicon vias (TSVs) may be formed through the thickness of the first die 3 to provide electrical communication between the second die 2 and the external board. Providing TSVs can increase manufacturing costs and introduce additional manufacturing steps. Thus, the embodiments illustrated in FIGS. 2A-2C can advantageously be used without TSVs by providing direct electrical communication between the second die 2 and the active surface of the first die 3. Accordingly, the embodiments of FIGS. 2A-2C may reduce manufacturing costs associated with TSVs.

Figure 2C:
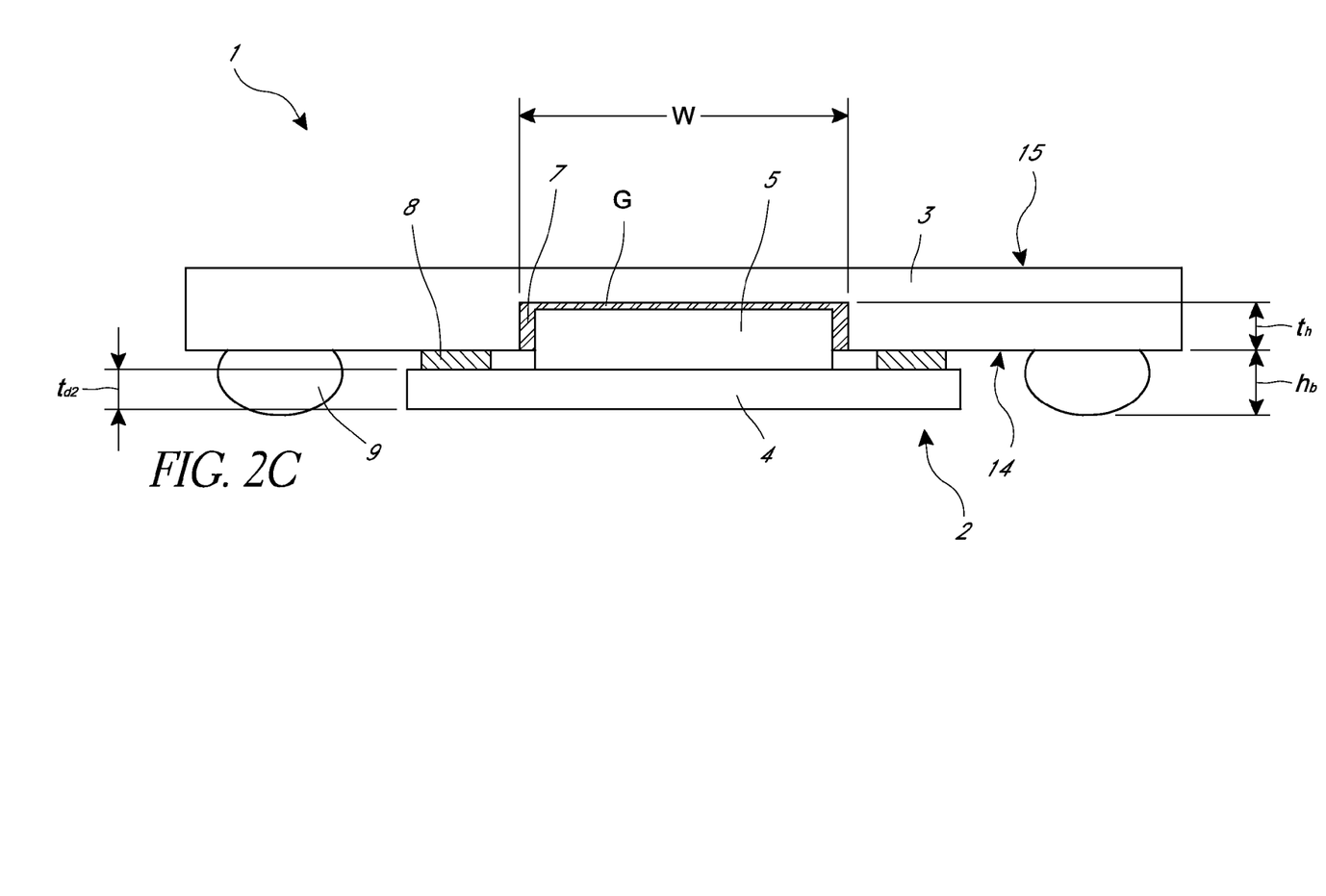
FIG. 2C is a schematic side cross-sectional view of an integrated device package in which a first integrated device die with a recess is coupled with a second integrated device die on the underside of the first integrated device die, according to another embodiment.

FIG. 2C is a schematic side cross-sectional view of an integrated device package 1 in which a first integrated device die 3 with a recessed hole 7 is coupled with a second integrated device die 2 on the underside of the first integrated device die 3, according to another embodiment. Unless otherwise noted, components that are the same as or similar to components of FIGS. 1A-2B are denoted by the same reference numerals. For example, as with FIG. 2A, the second die 2 (which may comprise a MEMS die) can be flip-chip mounted to a first side 14 of the first die 3 (which may comprise a processor die) by way of first contacts 8. A plurality of second contacts 9 may be disposed on the first side 14 of the first die 3 and can serve as package leads configured to connect to an external substrate or board such that the first die 3 faces the external substrate. A height $h_b$ of the second contacts 9 can be greater than a thickness $t_{d2}$ of the base portion 4 of the second die 2.

Unlike the embodiment of FIGS. 2A-2B, however, the hole 7 in the first side 14 of the processor die 3 can comprise a blind hole or recess having a height $t_h$ representing the height from the first side 14 to the floor of the recessed hole 7. Disposing the attachment 5 of the second die 2 in the hole 7 can reduce the overall height of the package by the height $t_h$, less the height of any gap G between the top of the attachment 5 and the ceiling of the hole 7. Moreover, the recessed hole 7 can protect the attachment 5 and underlying sensitive components from external stresses, as explained herein. The ceiling of the hole 7 can further protect the attachment 5 from external stresses. In addition, the package 1 of FIG. 2C may not include a molding material. In other embodiments, the package 1 can include a molding material, but the hole 7 can protect the attachment from stresses induced by the molding material.

Figure 3:
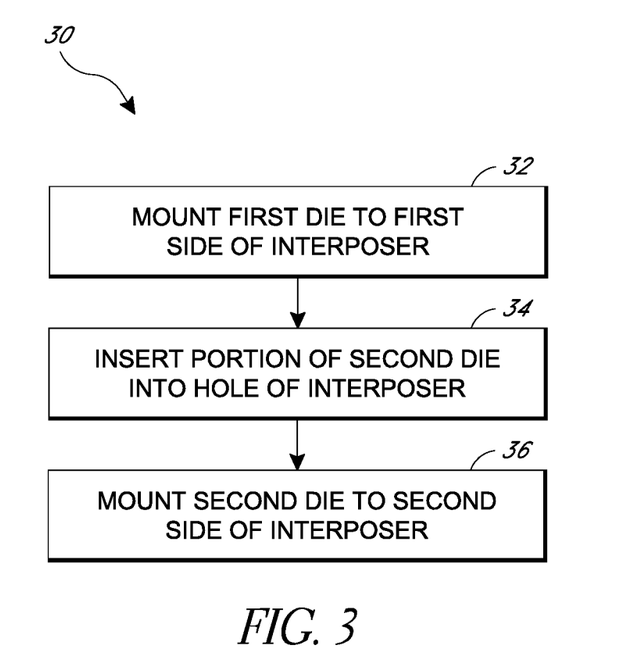
FIG. 3 is a flowchart illustrating a method for manufacturing an integrated device package, according to one embodiment.

FIG. 3 is a flowchart illustrating a method 30 for manufacturing an integrated device package, according to one embodiment. In a block 32, a first integrated device die is mounted to a first side of an interposer. The first die can comprise a processor die in some embodiments, such as an ASIC die. The first die can electrically communicate with the interposer by way of one or more first contact(s). The first contacts can comprise any suitable type of electrical interconnect, such as a solder ball, a metallic (e.g., gold) stud or interconnect, anisotropic conductive film (ACF), conductive paste, or any other type of connector. The first die 3 can be flip-chip mounted to the first side of the interposer.

The interposer can comprise any suitable type of platform. For example, the interposer can comprise a laminate or printed circuit board (PCB) substrate, a ceramic substrate, a metallized polymer substrate, a metallized glass substrate, a silicon interposer, or any other suitable type of platform. As explained herein, the interposer can comprise a hole formed through a second side of the interposer. The hole can comprise a through hole or a recessed hole.

Turning to a block 34, a portion of a second integrated device die can be inserted into the hole of the interposer. As explained herein, the second die can comprise a MEMS device die in some arrangements. For example, the second die can comprise a MEMS motion sensor die (e.g., a gyroscope, an accelerometer, etc.), a switching die, or any other type of MEMS die. The second die can include a base portion and an attachment extending from or coupled with the base portion. The MEMS device and other active components of the die may be formed or defined in the base portion. The attachment can comprise a cap that covers or protects the MEMS device or other active components of the base portion. The attachment can comprise the portion of the second die that is disposed in the hole of the interposer.

In a block 36, the second device die can be mounted to a second side of the interposer that is opposite the first side. For example, the second die (e.g., the base portion) can electrically communicate with the second side of the interposer by way of one or more second contact(s). The second contacts can comprise any suitable type of electrical interconnect, such as a solder ball, a metallic (e.g., gold) stud or interconnect, anisotropic conductive film (ACF), conductive paste, or any other type of connector. The second die can be flip-chip mounted to the second side of the interposer. After mounting the second die, the portion of the second die in the hole can be spaced by a gap from the floor of the hole (if a blind hole or recess) or from the first die (if a through hole).

In addition, in various embodiments, one or more third electrical contact(s) can be disposed on the first side of the interposer and can serve as package leads configured to electrically connect to an external system board. The third contacts can have a height larger than a thickness of the first device die such that a lowermost extent of the third contacts can be lower than a lowermost extent of the first die. In some embodiments, the third contacts can comprise solder balls that are disposed about an outer perimeter of the first device die.

Figure 4:
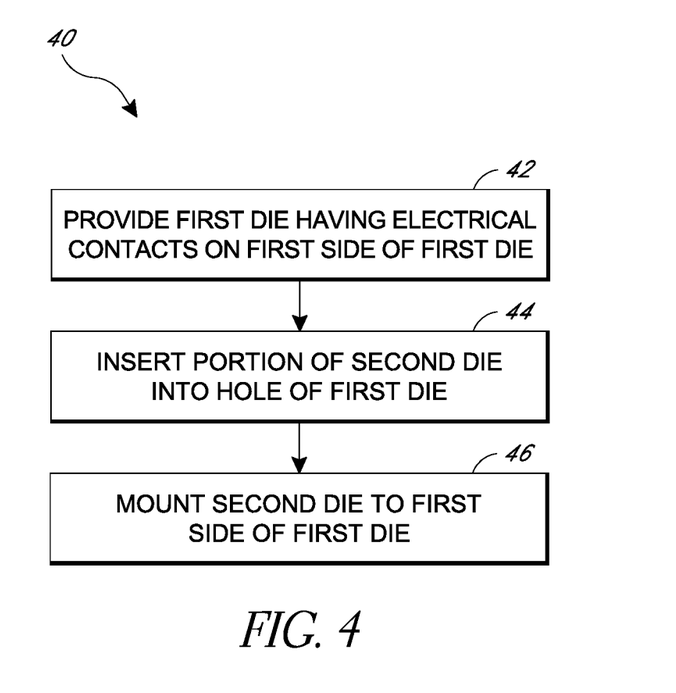
FIG. 4 is a flowchart illustrating a method for manufacturing an integrated device package, according to another embodiment.

FIG. 4 is a flowchart illustrating a method 40 for manufacturing an integrated device package, according to another embodiment. In a block 42, a first integrated device die having electrical contacts on a first side of the first die is provided. The first device die can comprise a processor die (e.g., an ASIC) in some arrangements. The first integrated device die can comprise a hole, which can be a through hole or a recess. The electrical contacts on the first die can serve as package leads configured to electrically connect to an external board. The electrical contacts can comprise a plurality of solder balls disposed about the periphery of the first die. When the first integrated device die is connected to the external board, the first die can face the external board.

Turning to a block 44, a portion of a second integrated device die is inserted into the hole of the first device die. The second device die can comprise a MEMS device die in some arrangements. For example, the second die can comprise a MEMS motion sensor die (e.g., a gyroscope, an accelerometer, etc.), a switching die, or any other type of MEMS die. The second die can include a base portion and an attachment extending from or coupled with the base portion. The MEMS device and other active components of the die may be formed or defined in the base portion. The attachment can comprise a cap that covers or protects the MEMS device or other active components of the base portion. The attachment can form the portion of the second die that is disposed in the hole of the first die. As explained herein, disposing the attachment in the hole can reduce the overall height of the package and can shield the sensitive portions of the second die from external stresses.

In a block 46, the second integrated device die can be mounted to the first side of the first integrated device die. For example, the second die (e.g., the base portion) can electrically communicate with the first side of the first die by way of one or more electrical interconnects, such as a solder ball, a metallic (e.g., gold) stud or interconnect, anisotropic conductive film (ACF), or conductive paste, or any other type of connector. The second die can be flip-chip mounted to the first side of the first integrated device die. After mounting the second die to the first die, the portion of the second die in the hole can be spaced by a gap from the ceiling of the hole (if a blind hole or recess) or from the second side of the first die (if a through hole).

In addition, as explained herein, the height of the electrical contacts on the first side of the first die can have a height that is greater than a thickness of the base portion of the second device die. A lowermost extent of the electrical contacts can be lower than a lowermost extent of the second die.

Applications

Devices employing the above described schemes can be mounted into various electronic devices, e.g., by way of a motherboard or system board. Examples of the electronic devices can include, but are not limited to, consumer electronic products, parts of the consumer electronic products, electronic test equipment, etc. Examples of electronic products can include, but are not limited to, a gaming device, a mobile phone, a computer, a hand-held or tablet computer, a personal digital assistant (PDA), an automobile, a multi functional peripheral device, medical devices, an automobile, etc. Further, the electronic device can include unfinished products.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
   a first integrated device die;
   a second integrated device die;
   an interposer disposed between the first integrated device die and the second integrated device die such that the first integrated device die is flip-chip mounted to and electrically coupled to a first side of the interposer and the second integrated device die is flip-chip mounted to and electrically coupled to a second side of the interposer, the first side opposite the second side,
   wherein the interposer comprises a hole through at least the second side of the interposer, the first integrated device die including first bond pads connected to the first side of the interposer outside the hole, a first portion of the second integrated device die extending into the hole and a second portion of the second integrated device die disposed vertically and laterally outside the hole on the second side of the interposer, the second portion including second bond pads connected to the second side of the interposer outside the hole.

2. The package of claim 1, wherein the hole comprises a through hole through the interposer.

3. The package of claim 1, wherein the hole comprises a recess formed partially through a thickness of the interposer.

4. The package of claim 1, further comprising an electrical contact disposed on the first side or the second side of the interposer, the electrical contact configured to electrically connect to an external substrate, and wherein the electrical contact has a height that is greater than a thickness of at least one of the first integrated device die and the second integrated device die.

5. The package of claim 4, wherein the electrical contact comprises a plurality of solder balls disposed on the first side of the interposer and wherein the height of the solder balls is greater than the thickness of the first integrated device die.

6. The package of claim 5, wherein the solder balls are disposed around an outer perimeter of the first integrated device die such that a lowermost extent of the solder balls is positioned below a lowermost extent of the first integrated device die.

7. The package of claim 1, wherein the package is not encapsulated with a molding material.

8. The package of claim 1, wherein the second integrated device die comprises a microelectromechanical systems (MEMS) die, and wherein the first portion of the second integrated device die extending into the hole comprises a cap disposed over a MEMS device of the MEMS die.

9. The package of claim 8, wherein the first integrated device die comprises a processor die.

10. The package of claim 1, wherein the second portion of the second integrated device die is wider than the hole.

11. The package of claim 10, further comprising a plurality of electrical contacts disposed between and electrically connecting the second integrated device die and the interposer, the electrical contacts disposed on an outer region of the second portion which surrounds the hole.

12. The package of claim 1, wherein the hole has a major dimension in a lateral direction in a range of 1 mm to 5 mm.

13. The package of claim 1, wherein the first portion of the second integrated device die is spaced from and does not contact the first integrated device die.

14. The package of claim 1, wherein the interposer comprises a through-silicon via (TSV) to provide electrical communication between the first integrated device die and the second integrated device die.

15. The package of claim 1, wherein the first portion of the second integrated device die floats inside a gap defined by the hole such that the first portion does not mechanically connect to the first integrated device die or to the interposer.

16. An integrated device package comprising:
   a first integrated device die;
   a second integrated device die;
   an interposer disposed between the first integrated device die and the second integrated device die such that the first integrated device die is flip chip mounted to and electrically coupled to a first side of the interposer and the second integrated device die is flip chip mounted to and electrically coupled to a second side of the interposer, the first side opposite the second side,
   wherein the interposer comprises a hole through at least the second side of the interposer, a portion of the second integrated device die extending into the hole,
   wherein the second integrated device die comprises a microelectromechanical systems (MEMS) die, and wherein the portion of the second integrated device die extending into the hole comprises a cap disposed over a MEMS device of the MEMS die,
   wherein first bond pads of the first integrated device die connect to the first side of the interposer outside the hole by way of one or more first contacts, and wherein second bond pads of the MEMS die connect to the second side of the interposer outside the hole by way of one or more second contacts.

17. The package of claim 16, wherein the first integrated device die comprises a processor die.

18. A method of manufacturing an integrated device package, the method comprising:
    flip chip mounting and electrically coupling a first integrated device die to a first side of an interposer;
    inserting a first portion of a second integrated device die into a hole of the interposer;
    flip chip mounting and electrically coupling the second integrated device die to a second side of the interposer that is opposite the first side such that a second portion of the second integrated device die is disposed vertically and laterally outside the hole on the second side of the interposer;
    connecting first bond pads of the first integrated device die to the first side of the interposer outside the hole; and
    connecting second bond pads of the second portion of the second integrated device die to the second side of the interposer outside the hole.

19. The method of claim 18, wherein the first integrated device die comprises a processor die, and wherein the second integrated device die comprises a microelectromechanical systems (MEMS) die.

20. The method of claim 18, further comprising a plurality of electrical contacts disposed on the first side of the interposer, wherein a height of the electrical contacts is greater than a thickness of the first integrated device die.

* * * * *